(12) United States Patent
Huang

(10) Patent No.: US 11,063,561 B1
(45) Date of Patent: Jul. 13, 2021

(54) RECEIVER CIRCUIT WITH INPUT COMMON MODE VOLTAGE SENSING

(71) Applicant: AMAZING MICROELECTRONIC CORP., New Taipei (TW)

(72) Inventor: Hsun-Hsiu Huang, Hsinchu County (TW)

(73) Assignee: Amazing Microelectronic Corp., New Taipei (TW)

( * ) Notice: Subject to any disclaimer, the term of this patent is extended or adjusted under 35 U.S.C. 154(b) by 0 days.

(21) Appl. No.: 16/941,829

(22) Filed: Jul. 29, 2020

(51) Int. Cl.
*H03F 3/18* (2006.01)
*H03F 3/189* (2006.01)
*H03F 3/45* (2006.01)
*H04L 12/40* (2006.01)

(52) U.S. Cl.
CPC ......... *H03F 3/189* (2013.01); *H03F 3/45179* (2013.01); *H03F 3/45668* (2013.01); *H04L 12/40* (2013.01); *H03F 2200/451* (2013.01); *H03F 2203/45054* (2013.01); *H04L 2012/40215* (2013.01)

(58) Field of Classification Search
CPC .. H03F 3/189; H03F 3/45179; H03F 3/45668; H03F 2200/451; H03F 2203/45054; H04L 12/40; H04L 2012/40215
See application file for complete search history.

(56) References Cited

U.S. PATENT DOCUMENTS 7,567,105 B2 * 7/2009 Trichy ................ G06F 13/4072 326/86
9,509,488 B1 * 11/2016 Huang ................ H04L 25/0276
10,042,807 B2 8/2018 Hinderer et al.
10,778,481 B1 * 9/2020 Glenn ................. H04L 25/4902
10,785,066 B1 * 9/2020 van Dijk ............... H04L 12/417
2003/0071673 A1 * 4/2003 Jordanger ........... H03F 3/45704 327/333
2014/0156893 A1 * 6/2014 Monroe .............. G06F 13/3625 710/117
2018/0341615 A1 * 11/2018 Hinderer ............. G06F 13/4282

FOREIGN PATENT DOCUMENTS

| | | |
|---|---|---|
| CN | 104753520 A | 7/2015 |
| CN | 109213262 A | 1/2019 |
| TW | 200828929 A | 7/2008 |
| TW | 201019591 A1 | 5/2010 |
| TW | 201442517 A | 11/2014 |

* cited by examiner

*Primary Examiner* — Freshteh N Aghdam
(74) *Attorney, Agent, or Firm* — Rosenberg, Klein & Lee

(57) ABSTRACT

A receiver circuit with input common mode voltage sensing is provided. The receiver circuit is applied to a controller area network and comprises a resistor assembly, connected with a high end and a low end of the controller area network, a common mode voltage sensor and a receiving amplifier. The resistor assembly bucks voltage, respectively generating the high end and low end voltage divisions at first and second nodes and outputting the voltage divisions to the receiving amplifier to generate a resultant signal to an output end of the controller area network. The common mode voltage sensor is connected between the resistor assembly and the receiving amplifier, and able to sense the common mode voltage on bus and control the voltage on center tap of the resistor assembly so the receiver circuit for controller area network can receive the differential signal with a much wider input common mode range.

20 Claims, 15 Drawing Sheets

RECEIVER CIRCUIT WITH INPUT COMMON MODE VOLTAGE SENSING

BACKGROUND OF THE INVENTION

Field of the Invention

The present invention relates to a receiver circuit of a controller area network. More particularly, the present invention is related to a receiver circuit with input common mode voltage sensing, such that the receiver circuit is able to receive a signal ranging between a maximum common mode voltage and a minimum common mode voltage.

Description of the Prior Art

As known, controller area network (CAN) is a kind of specification established in early 1990's, got standardized as ISO 11898-1 in 1993, and widely used in all kinds of vehicles and electronic devices later on. In general, controller area network includes a serial bus, which provides high security level and efficient real time control. Also, it is able to ensure debugging and priority determining mechanism, thereby making transmissions for internet messages much more reliable and efficient than ever. From such a point of view, it is believed that the controller area network nowadays is not only characterized by highly flexible adjustment ability which can accommodate more station numbers in existed internet without modifying its software and/or hardware, but also enhances network upgrading conveniences since its data transmission path do not need to build upon certain specific standard stations.

In a vehicular environment, great ground voltage shift exists between the ground terminals of different communication nodes. The maximum level of the ground shift voltage will be further increased by batteries with higher output voltage be applied in future vehicles. For example, the output voltage level of the batteries applied in traditional gasoline vehicles is 12V. However, the output voltage level of the batteries applied in modern electric vehicle has been increased to 48V for longer battery life currently. Therefore, it is necessary to improve the common mode input voltage range of the CAN transceiver integration circuit continuously so as to normally receive information in the case that great ground voltage shift exists between the ground terminals of different communication nodes. In addition, in order to avoid electromagnetic emission (EME) from the communication network to interfere other functions of the vehicle, the common mode signal of the CAN bus must be maintained at a fixed DC voltage and avoid any unnecessary high-frequency fluctuation on the common mode signals during the circuit operation.

Please refer to FIG. 1, which shows a conventional transceiver integration circuit of a controller area network (CAN) in prior arts. FIG. 2 schematically shows a dominant state and a recessive state according to FIG. 1. Apparently, the controller area network (CAN) has two states: a recessive state R while transmitting data of 1 and a dominant state D while transmitting data of 0. During the dominant state D, the transmitter generates a high end voltage VCANH and a low end voltage VCANL to the high end CANH and the low end CANL of the CAN bus. And, a summation of (VCANH+VCANL)=2*(Common mode signal on the CAN bus). For the purpose of maintaining low EME level, it is known that, (VCANH+VCANL) should be kept constant and at a fixed value during the transition between the dominant state D and the recessive state to R.

In Dominant State D: the first field effect transistor MP1 and the second field effect transistor MN1 in transmitter (TX) turn on:

$$VCANH+VCANL=VCC*(2*RONMN1+60)/(RONMP1+RONMN1+60); \quad (1)$$

wherein RONMP1 is the turn-on resistance of the first field effect transistor MP1, RONMN1 is the turn-on resistance of the second field effect transistor MN1, the resistance of the resistor RP1 is 30 ohm, the resistance of the resistor RN1 is 30 ohm and 60 is the sum of the resistances of the two resistors RP1 and RN1.

In Recessive State R: the first field effect transistor MP1 and the second field effect transistor MN1 in transmitter (TX) turn off:

The operational amplifier OP1 will drive the high end voltage VCANH and the low end voltage VCANL to $VCM_{REF}$.

$$VCANH+VCANL=2*VCM_{REF}; \quad (2)$$

Please refer to the following Equation (3). In order to keep VCANH+VCANL in Equation (1) and in Equation (2) constant during dominant and recessive state and achieve low EME, applying a reference voltage generation circuit in transmitter side is needed and unavoidable to generate $VCM_{REF}$, which is equal to common mode signal on the CAN bus during the dominate state D.

$$\text{(Common mode signal on the CAN bus)} = \tfrac{1}{2}*(VCANH+VCANL) = VCM_{REF} = VCC*(RONMN1+30)/(RONMP1+RONMN1+60); \quad (3)$$

Moreover, please refer to FIG. 3, which shows a receiver circuit (RX) of FIG. 1.

Common mode voltage on CAN bus line:

$$(V_{CM\_BUS})=[VCANH+VCANL]/2$$

Common mode voltage on receiving amplifier input:

$$(V_{CM\_DIV})=[VCANH_{DIV}+VCANL_{DIV}]/2$$

In general case, R1=R4, R2=R3

$$V_{CM\_DIV}=(V_{CM\_BUS}-VCM_{REF})*[R2/(R1+R2)]+VCM_{REF}$$

Assume that $[R2/(R1+R2)]=\tfrac{1}{15}$, and $VCM_{REF}=2.5V$

When $V_{CM\_BUS}=+50V$, $V_{CM\_DIV}=(50-2.5)/15+2.5=5.667V$.

When $V_{CM\_BUS}=-50V$, $V_{CM\_DIV}=(-50-2.5)/15+2.5=-1V$.

As a result, please refer to FIG. 4, which shows a result of $V_{CM\_DIV}$ according to $V_{CM\_BUS}$ ranging from +50V to −50V. It is obvious that for receiving controller area network (CAN) bus signal with +50V to −50V common mode range, the receiving amplifier needs to have the (5.667V to −1V) input common mode voltage range capability which exceeds the typical CAN bus supply voltage (5V to 0V). Therefore, a special designed receiving amplifier is necessary, whereby increase the circuit complexity.

Therefore, on account of above, to overcome the above-mentioned problem, it should be obvious that there is indeed an urgent need for the professionals in the field for a novel receiver circuit to be developed that is capable of sensing input common mode voltage, and has the ability to receive differential signal with wide input common mode range (−50V to +50V) that exceeds the typical CAN supply voltage (0 to 5V), so as to effectively solve the above mentioned problem occurring in the prior design.

SUMMARY OF THE INVENTION

In order to overcome the above mentioned disadvantages, one major objective in accordance with the present invention is provided for a novel receiver circuit with input common mode voltage sensing. By employing the proposed receiver circuit with input common mode voltage sensing of the present invention, receiver for controller area network (CAN) is able to receive the differential signal with wide input common mode range (−50V to +50V) that exceeds the typical CAN supply voltage (0 to 5V), without extra circuits to be designed and circuit complexity to be increased.

For achieving the above mentioned objectives, the present invention provides a receiver circuit with input common mode voltage sensing, which is electrically connected with an output end of the receiver circuit of a controller area network (CAN) and applicable to a transceiver integration circuit of the controller area network. The proposed receiver circuit comprises a resistor assembly, a common mode voltage sensor and a receiving amplifier.

The resistor assembly is electrically connected with a high end and a low end of the controller area network (CANH and CANL) and including a first resistor, a second resistor, a third resistor and a fourth resistor. A first node is arranged between the first resistor and the second resistor, a second node is arranged between the third resistor and the fourth resistor, and a third node is arranged between the second resistor and the third resistor. The first resistor is electrically connected with the high end and the first node, and the fourth resistor is electrically connected with the low end and the second node. The resistor assembly receives a high end voltage (VCANH) from the high end and a low end voltage (VCANL) from the low end and bucks voltage to generate and output a high end voltage division (VCANH$_{DIV}$) at the first node, a low end voltage division (VCANL$_{DIV}$) at the second node and a contact voltage (VCT) at the third node.

The common mode voltage sensor includes a sense input end and a sense output end. The sense input end is electrically connected with a reference voltage source (VCM$_{REF}$) and the sense output end is electrically connected to the third node of the resistor assembly. A first input terminal, a second input terminal and a third input terminal of the common mode voltage sensor are connected with and receiving the high end voltage division (VCANH$_{DIV}$) from the first node, the low end voltage division (VCANL$_{DIV}$) from the second node and the contact voltage (VCT) from the third node, respectively. As such, the common mode voltage sensor generates and outputs a sense output voltage (VSENSE_O) at the sense output end.

The receiving amplifier includes a first receiving end and a second receiving end which are respectively connected to the first node of the resistor assembly and the second node of the resistor assembly to receive the high end voltage division (VCANH$_{DIV}$) and the low end voltage division (VCANL$_{DIV}$). As a result, the receiving amplifier accordingly generates a resultant signal, and outputs the resultant signal to the output end of the receiver circuit of the controller area network.

Functions of the common mode voltage sensor of the present invention comprises determining.

1. if $\{½*[VCANH_{DIV}+VCANL_{DIV}]\}>\{VCT+V_{TH\_SEN}\}$, then the sense output voltage (VSENSE_O) is set to a ground voltage (GND); otherwise the sense output voltage (VSENSE_O) is equal to the reference voltage source (VCM$_{REF}$).

Alternatively, the common mode voltage sensor of the present invention determines:

2. if $\{½*[VCANH_{DIV}+VCANL_{DIV}]\}<\{VCT-V_{TH\_SEN}\}$, then the sense output voltage (VSENSE_O) is set to a power source voltage (VCC); otherwise the sense output voltage (VSENSE_O) is equal to the reference voltage source (VCM$_{REF}$).

Alternatively, the common mode voltage sensor of the present invention determines:

3. if $\{½*[VCANH_{DIV}+VCANL_{DIV}]\}>\{VCT+V_{TH\_SEN}\}$, then the sense output voltage (VSENSE_O) is set to a ground voltage (GND); and if $\{½*[VCANH_{DIV}+VCANL_{DIV}]\}<\{VCT-V_{TH\_SEN}\}$, then the sense output voltage (VSENSE_O) is set to a power source voltage (VCC); and if $\{VCT-V_{TH\_SEN}\}<\{½*[VCANH_{DIV}+VCANL_{DIV}]\}<\{VCT+V_{TH\_SEN}\}$, then the sense output voltage (VSENSE_O) is equal to the reference voltage source (VCM$_{REF}$).

According to the present invention, V$_{TH\_SEN}$ is a preset threshold offset value stored in a comparator of the common mode voltage sensor.

According to the present invention, the above mentioned three types of determining mechanism of the common mode voltage sensor can be employed depending on the input common mode voltage receiving range of the receiving amplifier and varies with the input common mode voltage receiving range of the receiving amplifier.

In general, people skilled in the art are able to make modifications or variations according to the present invention without departing the spirits of the present invention, and yet still fall into the scope of the present invention.

In the embodiments of the present invention, the common mode voltage sensor is composed of a comparator and an operational amplifier. The comparator receives the high end voltage division (VCANH$_{DIV}$) from the first input terminal, the low end voltage division (VCANL$_{DIV}$) from the second input terminal and the contact voltage (VCT) from the third input terminal to generate and output 1. a first outcome signal (PL), or 2. a second outcome signal (PU), or 3. both the first outcome signal (PL) and the second outcome signal (PU).

The operational amplifier is electrically connected with the comparator to receive 1. the first outcome signal (PL), or 2. the second outcome signal (PU), or 3. both the first outcome signal (PL) and the second outcome signal (PU), and the operational amplifier accordingly generates and outputs an OP output signal as the sense output voltage (VSENSE_O).

According to one embodiment of the present invention:

1. if $\{½*[VCANH_{DIV}+VCANL_{DIV}]\}>\{VCT+V_{TH\_SEN}\}$, then the first outcome signal (PL) is equal to the power source voltage (VCC). The second outcome signal (PU) can be removed, or the second outcome signal (PU) is equal to the ground voltage (GND).

According to another embodiment of the present invention:

2. if $\{½*[VCANH_{DIV}+VCANL_{DIV}]\}<\{VCT-V_{TH\_SEN}\}$, then the second outcome signal (PU) is equal to the power source voltage (VCC). The first outcome signal (PL) can be removed, or the first outcome signal (PL) is equal to the ground voltage (GND).

Furthermore, according to yet an embodiment of the present invention:

3. if $\{VCT-V_{TH\_SEN}\}<\{½*[VCANH_{DIV}+VCANL_{DIV}]\}<\{VCT+V_{TH\_SEN}\}$, then the first outcome signal (PL) is equal to the second outcome signal (PU), which is the ground voltage (GND). In such an embodiment, the operational amplifier is an inverting closed-loop amplifier with unity gain feedback connection so as to generate the sense output voltage (VSENSE_O) as the reference voltage source (VCM$_{REF}$).

As a result, it is apparent that the present invention discloses a receiver circuit of a controller area network, and more particularly to a receiver circuit with input common mode voltage sensing capability. Therefore, by employing such design manners of the proposed present invention, the receiver circuit is able to receive the signal ranging between the maximum and minimum common mode voltage and reduce electromagnetic emission. The proposed circuit diagram of the present invention is effective in solving the conventional issues generating in the prior arts as discussed earlier without increasing the circuit complexity and fabrication cost. And thus, it is believed that the present invention is advantageous of successfully replacing the conventional receiver circuit and providing an ultra-wide common mode input voltage range.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
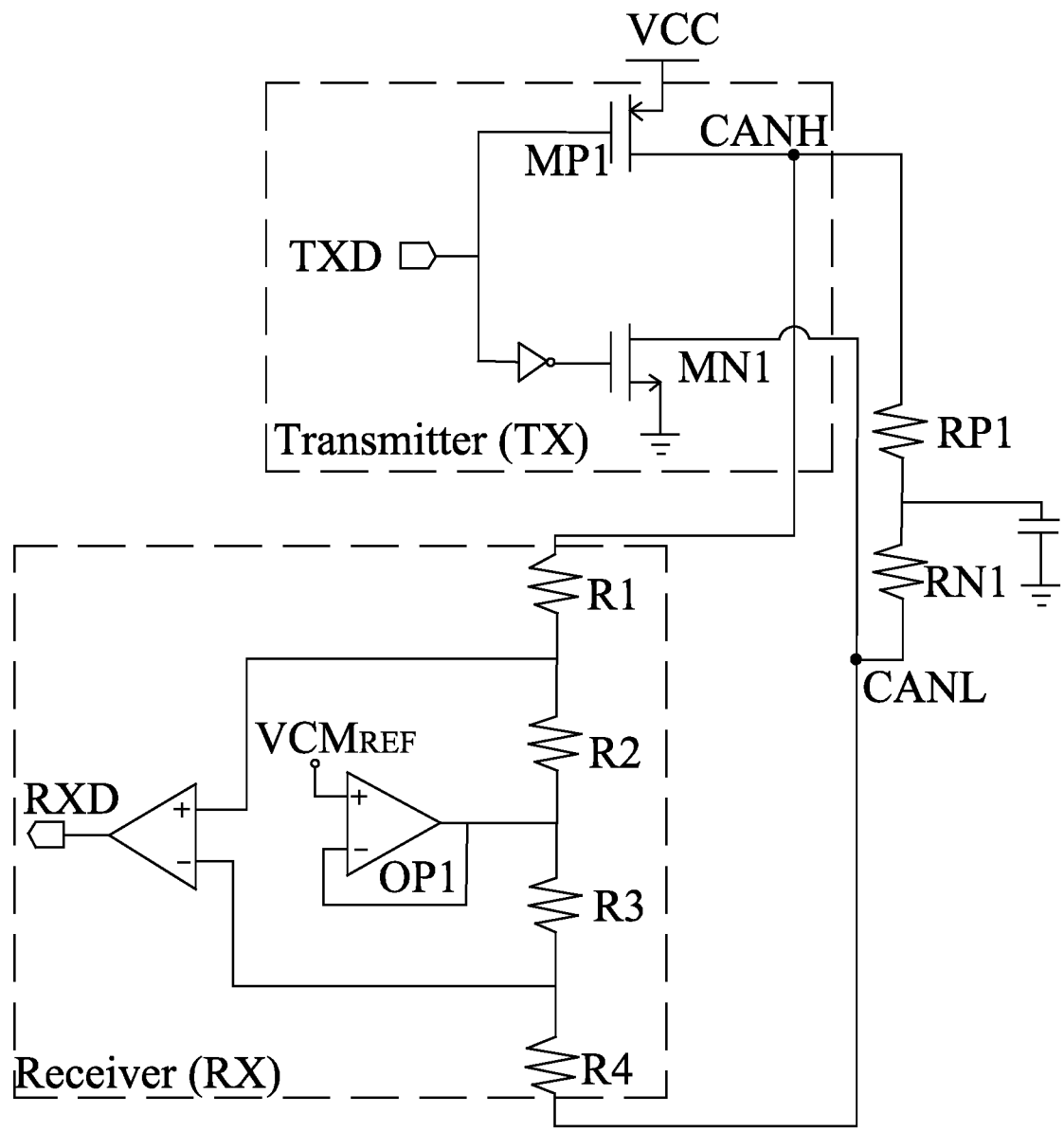
FIG. 1 shows a conventional transceiver integration circuit of a controller area network (CAN) in prior arts.
Figure 2:
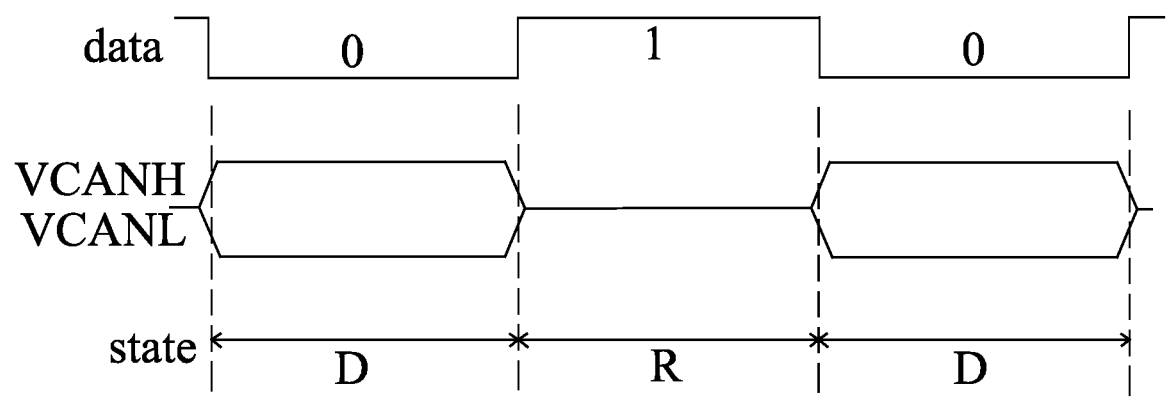
FIG. 2 schematically shows a dominant state and a recessive state according to FIG. 1 scheme.
Figure 3:
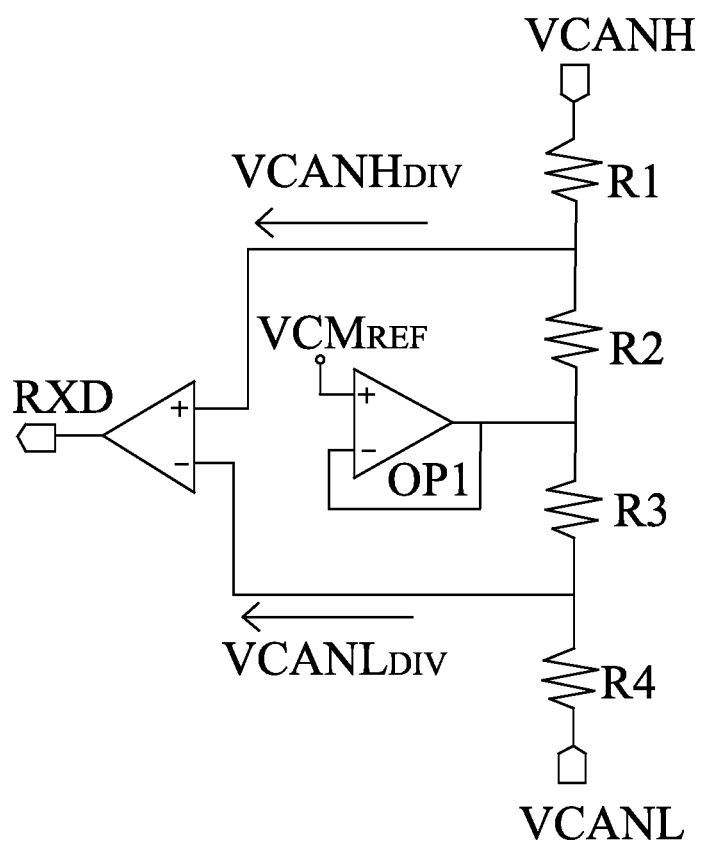
FIG. 3 shows a receiver circuit (RX) of FIG. 1.
Figure 4:
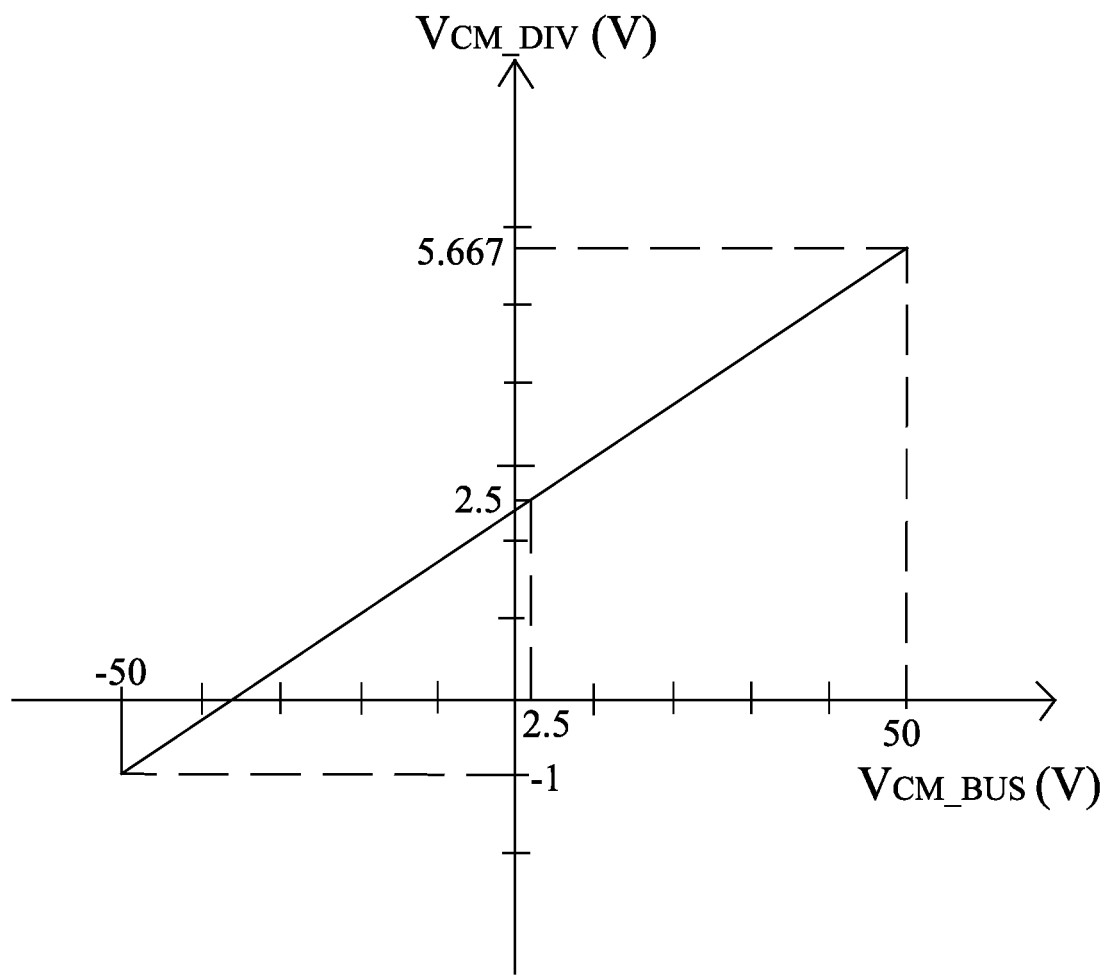
FIG. 4 shows a result of $V_{CM\_DIV}$ according to $V_{CM\_BUS}$ ranging from +50V to −50V according to FIG. 1 scheme.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

Figure 5:
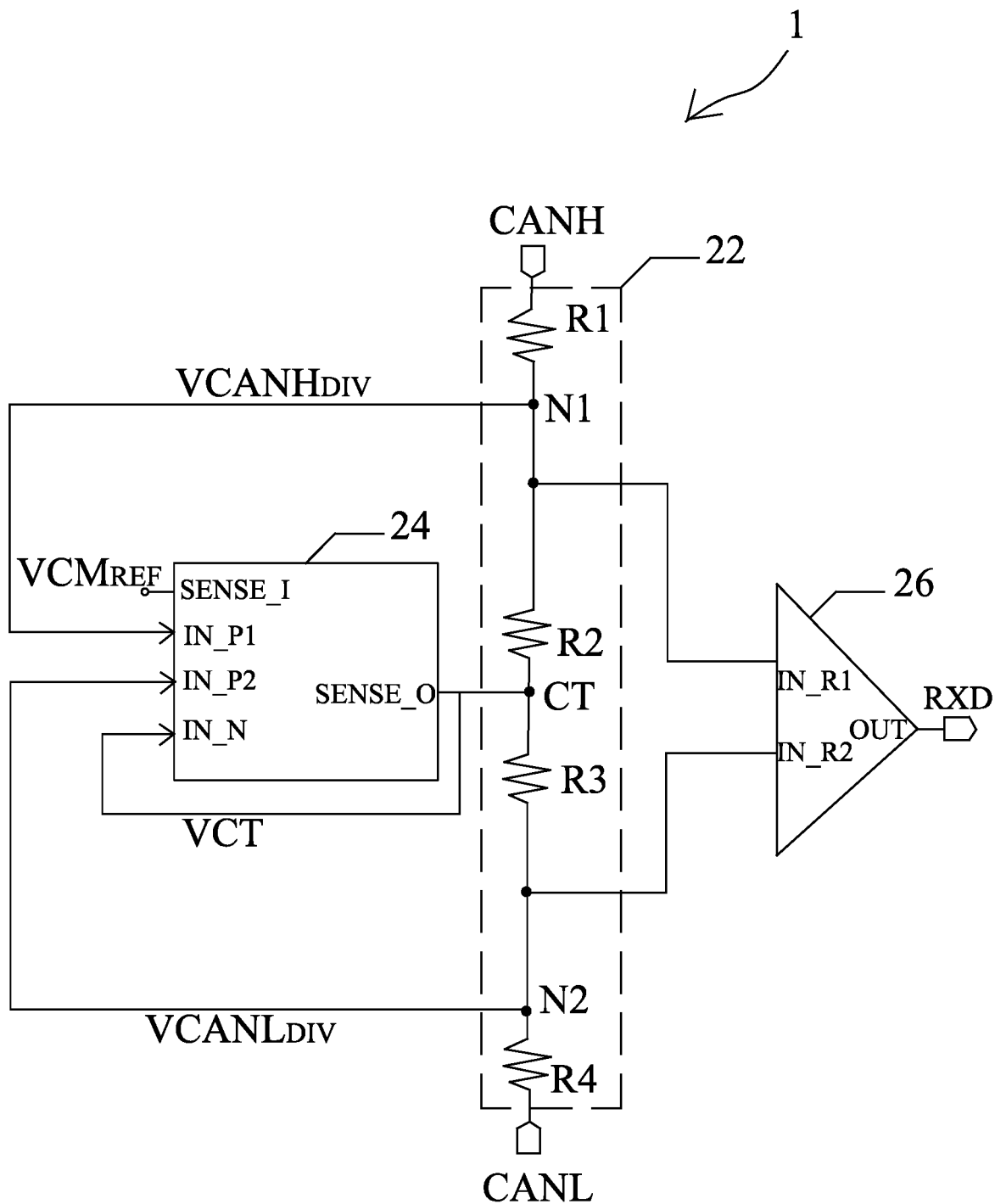
FIG. 5 shows a block diagram of the receiver circuit with input common mode voltage sensing in accordance with a first embodiment of the present invention.

The controller area network (CAN) is one of the field buses widely used internationally, featuring high bit rate, high anti-interference ability, and error detection capability. The controller area network has been extensively applied to the automobile industry and aircraft industry. The receiver circuit with input common mode voltage sensing of the present invention is aimed to receive a much wider common mode input voltage range than the conventional receiving circuits, by employing a common mode voltage sensor. Please refer to FIG. 5 for a first embodiment of the present invention, which shows a block diagram of the receiver circuit with input common mode voltage sensing in accordance with the first embodiment of the present invention. As shown in FIG. 5, the receiver circuit 1 is electrically connected with an output end RXD of the receiver circuit 1 of a controller area network (CAN) and applicable to a transceiver integration circuit of the controller area network. The receiver circuit 1 comprises a resistor assembly 22, a common mode voltage sensor 24 and a receiving amplifier 26. A main objective of the receiver circuit 1 is amplifying the differential signals of a controller area network (CAN) high end CANH and a controller area network (CAN) low end CANL, and converting to single-end digital signals on the output end RXD which voltage level is switched between power and ground.

According to the embodiment of the present invention, the resistor assembly 22 is electrically connected with the CAN high end CANH and the CAN low end CANL of the controller area network and includes a first resistor R1, a second resistor R2, a third resistor R3 and a fourth resistor R4 which are cascaded in sequence. A first node N1 is arranged between the first resistor R1 and the second resistor R2. A second node N2 is arranged between the third resistor R3 and the fourth resistor R4. A third node CT is arranged between the second resistor R2 and the third resistor R3. The first resistor R1 is electrically connected with the CAN high end CANH and the first node N1. The fourth resistor R4 is electrically connected with the CAN low end CANL and the second node N2. The resistor assembly 22 receives a high end voltage VCANH from the CAN high end CANH and a low end voltage VCANL from the CAN low end CANL. The resistor assembly 22 bucks the voltage and generate a high end voltage division $VCANH_{DIV}$ at the first node N1, a low end voltage division $VCANL_{DIV}$ at the second node N2 and a contact voltage VCT at the third node CT.

The resistor assembly 22 functions to provide a high impedance (normally about 30K ohms) between the CAN high end CANH and the CAN low end CANL during the recessive state and slightly attenuate the common mode voltages of the CAN high end CANH and the CAN low end CANL lest too high an input voltage burn down internal transistors.

According to the embodiment of the present invention, the common mode voltage sensor 24 includes a sense input end SENSE_I and a sense output end SENSE_O. The sense input end SENSE_I is electrically connected with a reference voltage source $VCM_{REF}$ and the sense output end SENSE_O is electrically connected to the third node CT of the resistor assembly 22. The common mode voltage sensor 24 further comprises a first input terminal IN_P1, a second input terminal IN_P2 and a third input terminal IN_N. The first input terminal IN_P1 is electrically connected with and receiving the high end voltage division $VCANH_{DIV}$ from the first node N1. The second input terminal IN_P2 is electrically connected with and receiving the low end voltage division $VCANL_{DIV}$ from the second node N2. The third input terminal INN is electrically connected with and receiving the contact voltage VCT from the third node CT. Accordingly, after receiving the high end voltage division $VCANH_{DIV}$ from the first input terminal IN_P1, the low end voltage division $VCANL_{DIV}$ from the second input terminal IN_P2 and the contact voltage VCT from the third input terminal IN_N, the common mode voltage sensor 24 is designed to generate and output a sense output voltage VSENSE_O at the sense output end SENSE_O.

According to the embodiment of the present invention, the receiving amplifier 26 includes a first receiving end IN_R1 and a second receiving end IN_R2. The first receiving end IN_R1 is electrically connected to the first node N1 of the resistor assembly 22 and receives the high end voltage division $VCANH_{DIV}$. The second receiving end IN_R2 is electrically connected to the second node N2 of the resistor assembly 22 and receives the low end voltage division $VCANL_{DIV}$. Upon receiving the high end voltage division $VCANH_{DIV}$ and the low end voltage division $VCANL_{DIV}$, the receiving amplifier 26 accordingly generates and outputs a resultant signal to the output end RXD of the receiver circuit 1 of the controller area network.

Figure 6:
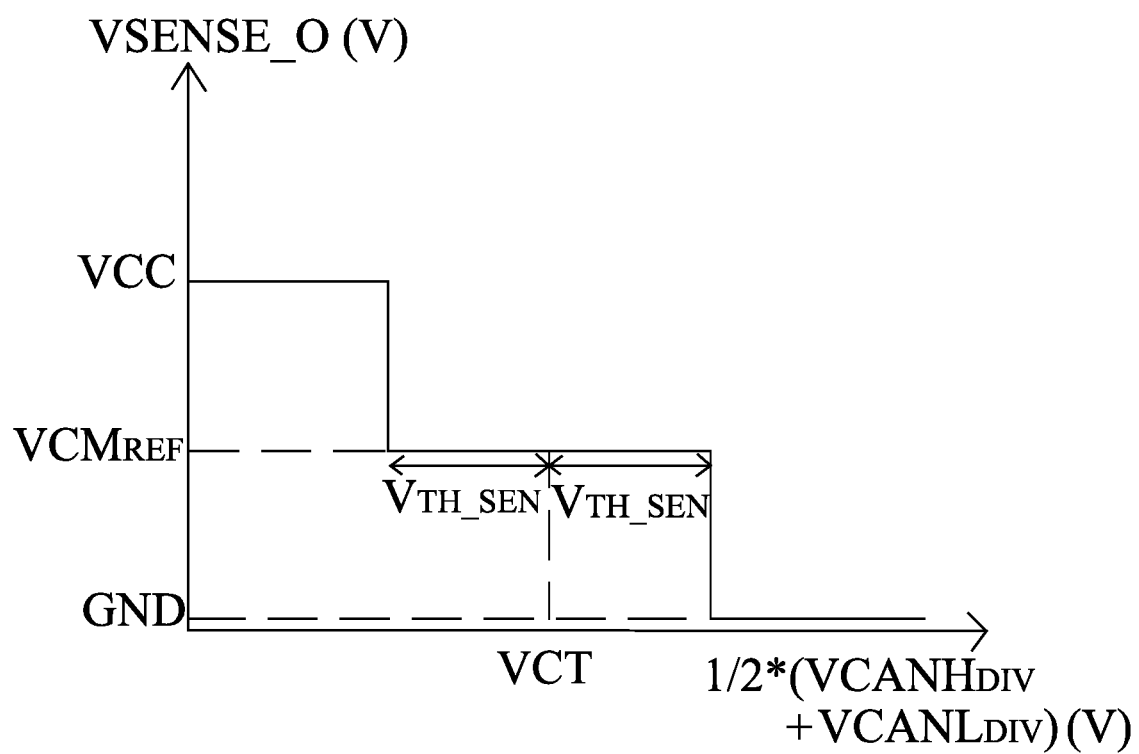
FIG. 6 shows the voltage diagram of the sense output voltage VSENSE_O of the common mode voltage sensor in accordance with the first embodiment of the present invention.

FIG. 6 shows the voltage diagram of the sense output voltage VSENSE_O of the common mode voltage sensor in accordance with the first embodiment of the present invention. From FIG. 6, it shows that the common mode voltage sensor 24 of the present invention determines:

if $\{½*[VCANH_{DIV}+VCANL_{DIV}]\}>\{VCT+V_{TH\_SEN}\}$, then the sense output voltage VSENSE_O is set to a ground voltage GND; and if $\{½*[VCANH_{DIV}+VCANL_{DIV}]\}<\{VCT-V_{TH\_SEN}\}$, then the sense output voltage VSENSE_O is set to a power source voltage VCC, wherein $V_{TH\_SEN}$ is a preset threshold offset value;

otherwise if $\{VCT-V_{TH\_SEN}\}<\{½*[VCANH_{DIV}+VCANL_{DIV}]\}<\{VCT+V_{TH\_SEN}\}$, the sense output voltage VSENSE_O is equal to the reference voltage source $VCM_{REF}$.

Figure 7:
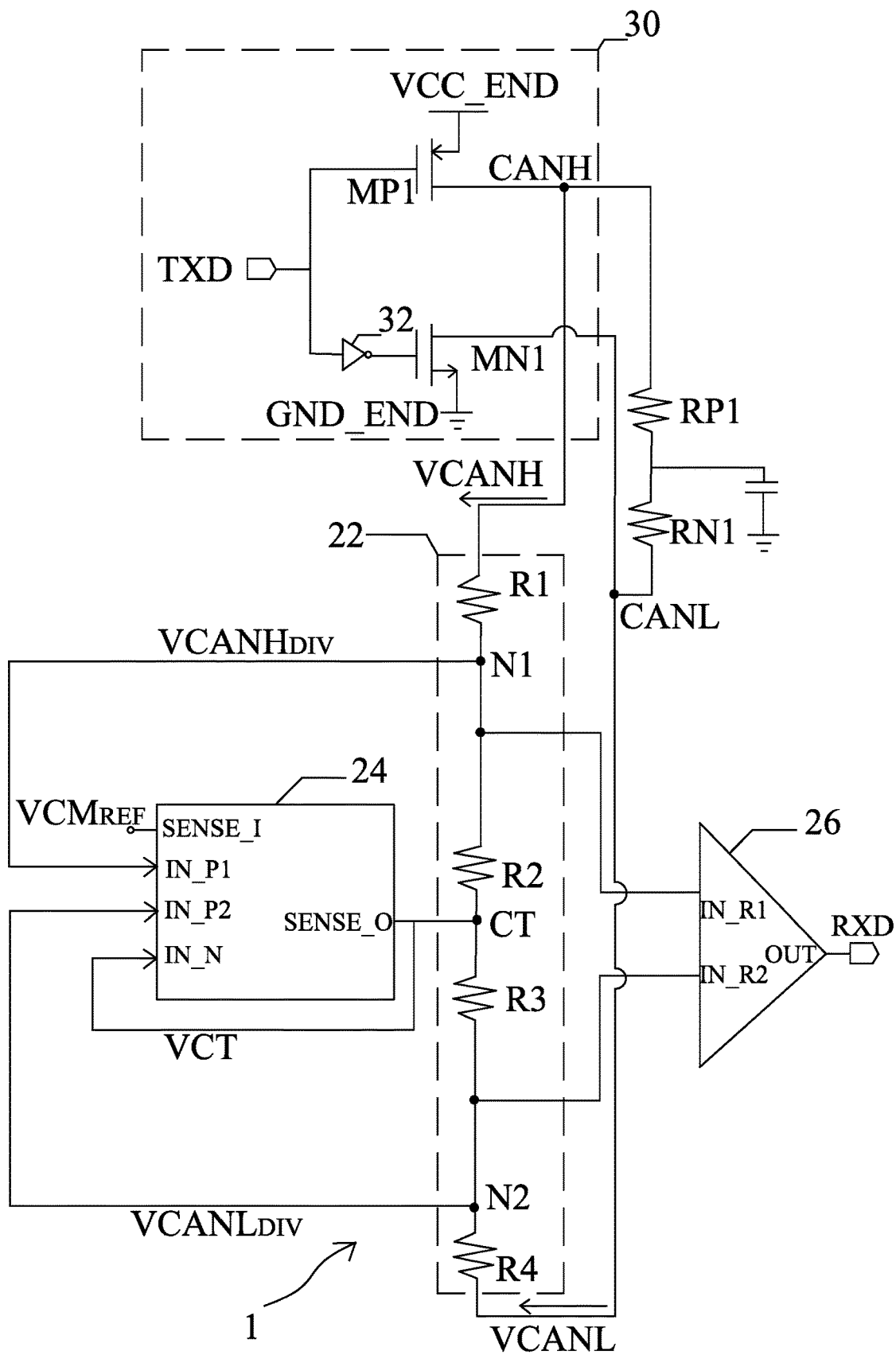
FIG. 7 shows a schematic diagram of the receiver circuit with input common mode voltage sensing in accordance with the first embodiment of the present invention, which is applied to a transceiver integration circuit of the controller area network.

FIG. 7 shows a schematic diagram of the receiver circuit with input common mode voltage sensing in accordance with the first embodiment of the present invention, which is applied to a transceiver integration circuit of the controller area network. The CAN transceiver integration circuit further comprises a transmitter 30. The transmitter 30 is electrically connected with the CAN high end CANH and the CAN low end CANL of the CAN bus. The receiver circuit 1 with input common mode voltage sensing of the present invention is electrically connected with the transmitter 30 through the CAN high end CANH and the CAN low end CANL of the CAN bus. The transmitter 30 is a standard transmitter applied to CAN bus. The transmitter 30 includes a power source end VCC_END, a first field effect transistor MP1, a transmitter input end TXD, a second field effect transistor MN1, a phase inverter 32, and a ground end GND_END. A resistor RP1 and a resistor RN1, each of which has a resistance of 30 ohms, are applied the transmitter 30 output to generate the voltage of the CAN high end CANH and the CAN low end CANL.

According to the embodiment of the present invention, the transmitter 30 is electrically connected with the high end and the low end and transmits a differential signal to the high end and the low end in a dominant state. A common mode voltage of the differential signal is supplied to and as a reference voltage source.

While the voltage of the transmitter input end TXD is zero, it is during the dominant state D, and the first field effect transistor MP1 and the second field effect transistor MN1 turn on. The first field effect transistor MP1, the second field effect transistor MN1, the 30-ohm resistor RP1, and the 30-ohm resistor RN1 are cascaded between the power source end VCC_END and the ground end GND_END to perform voltage division and generate the high end voltage VCANH and the low end voltage VCANL of the CAN bus. The power source voltage VCC is supplied from the power source end VCC_END, and the ground voltage GND is supplied from the ground end GND_END.

In the dominant state D, the high end voltage VCANH, the low end voltage VCANL, and the common mode voltage of the high end CANH and the low end CANL of the CAN bus are respectively expressed by Equations (4)-(6).

$$VCANH=VCC*(RONMN1+60)/(RONMP1+RONMN1+60); \quad (4)$$

$$VCANL=VCC*(RONMN1)/(RONMP1+RONMN1+60); \quad (5)$$

The common mode voltage during the dominant state $$D=½*(VCANH+VCANL)=VCC*(RONMN1+30)/(RONMP1+RONMN1+60) \quad (6)$$

wherein VCC is the power source voltage supplied from the power source end VCC_END, RONMP1 is the turn-on resistance of the first field effect transistor MP1, RONMN1 is the turn-on resistance of the second field effect transistor MN1, the resistance of the resistor RP1 is 30 ohm, the resistance of the resistor RN1 is 30 ohm and 60 is the sum of the resistances of the two resistors RP1 and RN1.

While the voltage of the transmitter input end TXD is equal to the power source voltage VCC, it is during the recessive state R. During the recessive state R, the first field effect transistor MP1 and the second field effect transistor MN1 turn off. Without input signals from other CAN transceiver, it is determined that common mode voltage sensor 24 of the present invention will drive both the high end voltage VCANH of the CAN high end CANH and the low end voltage VCANL of the CAN low end to the reference voltage source $VCM_{REF}$. As a result, in the recessive state R, the common mode voltage of the high end CANH and the low end CANL of the CAN bus is expressed by Equation (7).

The common mode voltage during the recessive state $$R = \frac{1}{2}*(VCANH+VCANL) = VCM_{REF}; \quad (7)$$

Please refer to the following Equation (8). In order to keep VCANH+VCANL in Equation (6) and in Equation (7) constant during dominant and recessive state and achieve low EME, applying a reference voltage generation circuit in transmitter side is needed and unavoidable to generate $VCM_{REF}$, which is equal to common mode signal on the CAN bus during the dominate state.

$$\text{(Common mode signal on the CAN bus)} = \frac{1}{2}*(VCANH+VCANL) = VCM_{REF} = VCC*(RONMN1+30)/(RONMP1+RONMN1+60); \quad (8)$$

As described earlier:
Common mode voltage on CAN bus line:

$$(V_{CM\_BUS}) = [VCANH+VCANL]/2$$

Common mode voltage on receiving amplifier input:

$$(V_{CM\_DIV}) = [VCANH_{DIV}+VCANL_{DIV}]/2$$

In general case, R1=R4, R2=R3

$$V_{CM\_DIV} = (V_{CM\_BUS}-VCT)*[R2/(R1+R2)]+VCM_{REF}$$

As referring to the function of the common mode voltage sensor of the present invention as indicated in the voltage diagram in FIG. 6:

If $[VCT-V_{TH\_SEN}] < V_{CM\_DIV} < [VCT+V_{TH\_SEN}]$, VSENSE_O=VCT=$VCM_{REF}$,
which results in the following Equation (9).

$$V_{CM\_DIV} = [V_{CM\_BUS}-VCM_{REF}]*[R2/(R1+R2)]+VCM_{REF}; \quad (9)$$

If $V_{CM\_DIV} > [VCT+V_{TH\_SEN}]$, VSENSE_O=VCT=GND, which results in the following Equation (10).

$$V_{CM\_DIV} = [V_{CM\_BUS}-GND]*[R2/(R1+R2)]+GND; \quad (10)$$

If $V_{CM\_DIV} < [VCT-V_{TH\_SEN}]$, VSENSE_O=VCT=VCC, which results in the following Equation (11).

$$V_{CM\_DIV} = [V_{CM\_BUS}-VCC]*[R2/(R1+R2)]+VCC; \quad (11)$$

Figure 8:
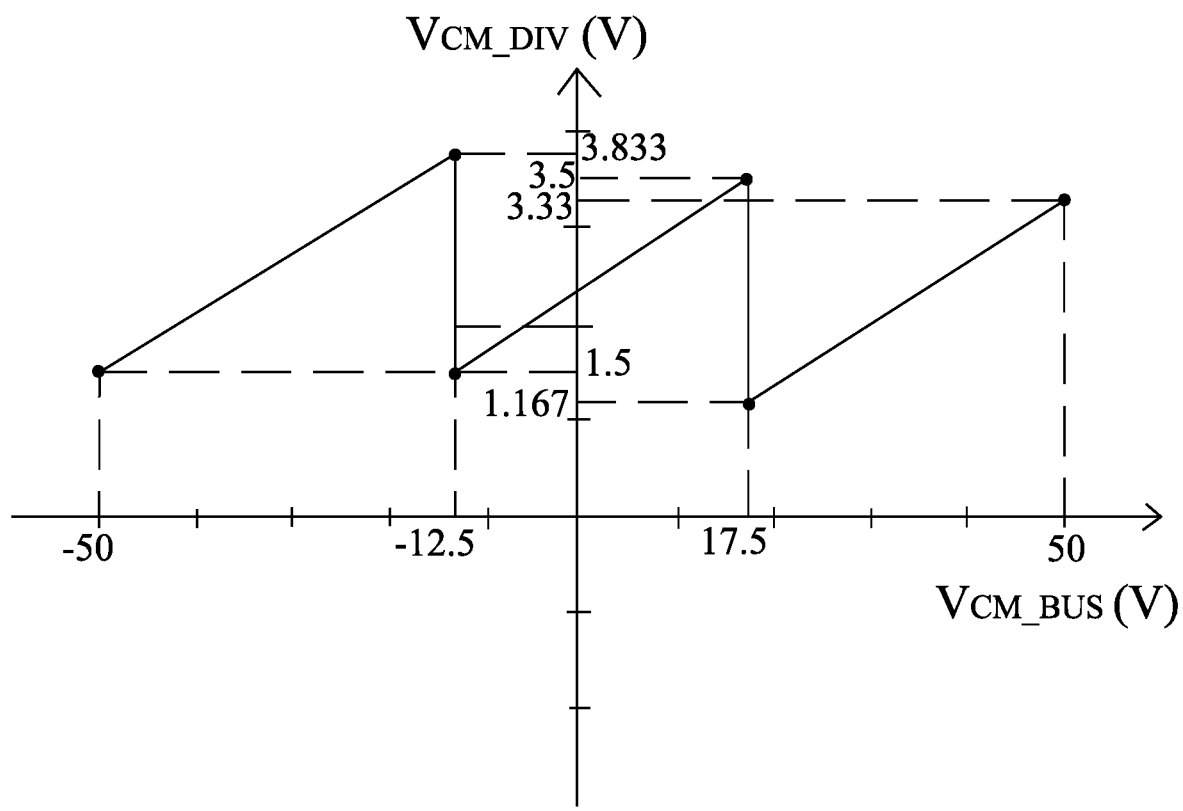
FIG. 8 shows a result of $V_{CM\_DIV}$ according to $V_{CM\_BUS}$ ranging from +50V to −50V in accordance with the first embodiment of the present invention.

Assume that $VCM_{REF}$=2.5V, R2/(R1+R2)=1/15, $V_{TH\_SEN}$=1V, GND=0V, VCC=5V in general case, the present invention accordingly yields to a result of $V_{CM\_DIV}$ according to $V_{CM\_BUS}$ ranging from +50V to −50V as shown in FIG. 8. From the voltage diagram disclosed in FIG. 8, it is obvious that for receiving CAN bus signal with +50 to −50V BUS common mode range, the receiving amplifier of the present invention only needs to have a (3.833V to 1.167V) input common mode voltage range capability, which still falls in the typical CAN bus supply voltage range (5V to 0V). Therefore, it is well proven that by employing the proposed techniques of the present invention, which discloses a receiver circuit with input common mode voltage sensing capability, much simpler and less complex receiving amplifier circuits can be utilized to achieve+50V to −50V BUS common mode range. In other words, the present invention is successfully designed to use simple and low-cost receiving amplifier circuit to achieve wide input common mode range and still maintain a fair low electromagnetic emission (EME) level.

Figure 9:
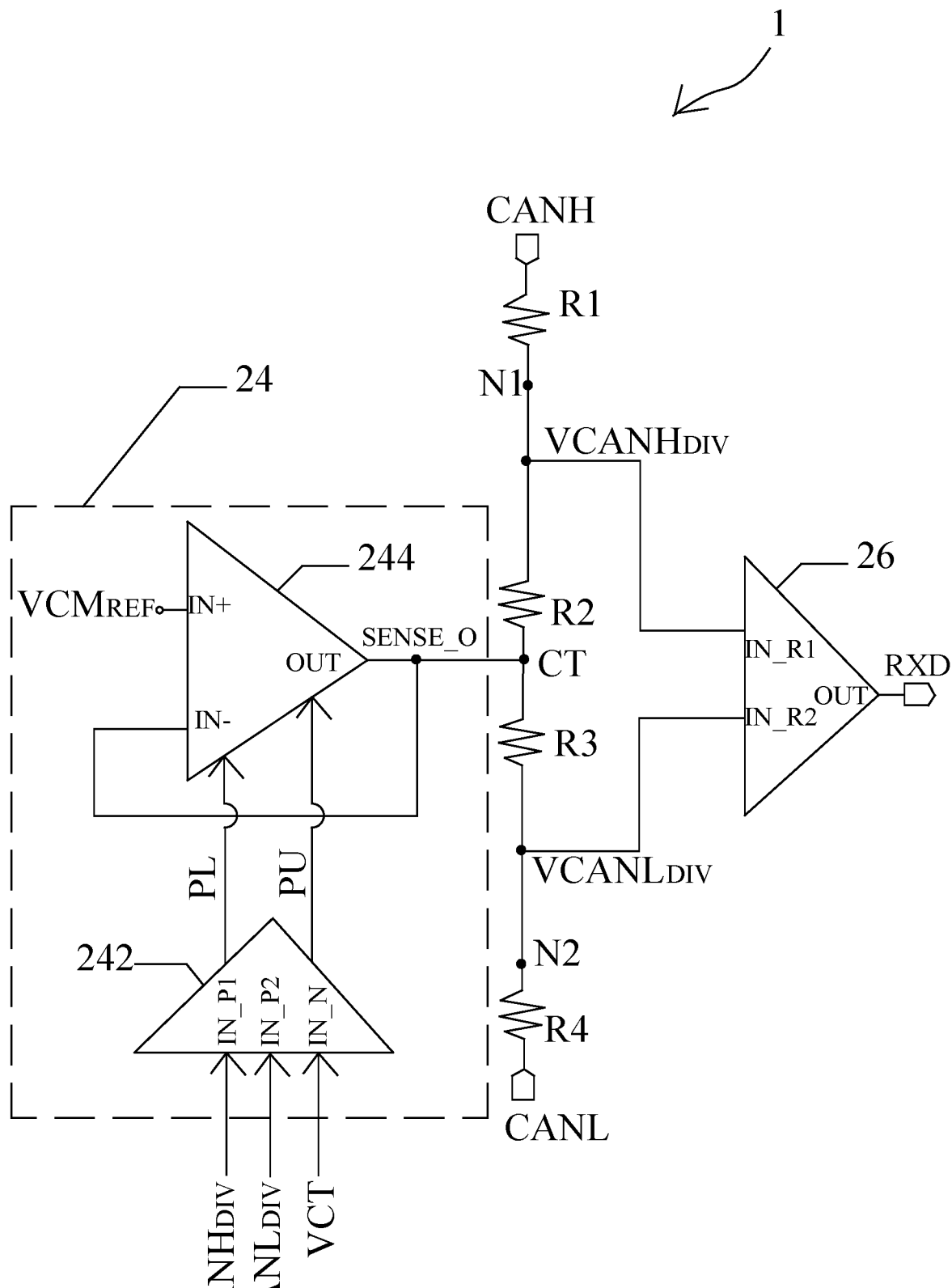
FIG. 9 shows a detailed circuit diagram for implementing the receiver circuit with input common mode voltage sensing in accordance with the first embodiment of the present invention.

To be more specific, please refer to FIG. 9, which shows a detailed circuit diagram for implementing the receiver circuit with input common mode voltage sensing in accordance with the first embodiment of the present invention.

The common mode voltage sensor 24 comprises a comparator 242 and an operational amplifier 244.

The comparator 242 includes the first input terminal IN_P1 and the second input terminal IN_P2 as two positive input ends, and the third input terminal INN as one negative input end of the comparator 242. As such, the comparator 242 outputs a first outcome signal PL and a second outcome signal PU according to the high end voltage division $VCANH_{DIV}$ from the first input terminal IN_P1, the low end voltage division $VCANL_{DIV}$ from the second input terminal IN_P2 and the contact voltage VCT from the third input terminal IN_N.

The determining mechanism of the comparator 242 is the same as what the Applicant has described in FIG. 6 as well as the derivation of the Equations (9) to (11).

If $\{\frac{1}{2}*[VCANH_{DIV}+VCANL_{DIV}]\} > \{VCT+V_{TH\_SEN}\}$, the comparator 242 outputs the first outcome signal PL=VCC, and the second outcome signal PU=GND; and
if $\{\frac{1}{2}*[VCANH_{DIV}+VCANL_{DIV}]\} < \{VCT-V_{TH\_SEN}\}$, the comparator 242 outputs the first outcome signal PL=GND, and the second outcome signal PU=VCC; and
if $\{\frac{1}{2}*[VCANH_{DIV}+VCANL_{DIV}]\}$ is between $\{VCT+V_{TH\_SEN}\}$ and $\{VCT-V_{TH\_SEN}\}$, the comparator 242 outputs the first outcome signal PL=GND, and the second outcome signal PU=GND.

According to the embodiment of the present invention, the preset threshold offset value $V_{TH\_SEN}$ is stored in the comparator 242. The preset threshold offset value $V_{TH\_SEN}$ can be 1V, for example. However, people skilled in the art are allowed to make variations of such a preset threshold offset value, based on different design needs and circuit specifications. The present invention is certainly not limited thereto.

Regarding the operational amplifier 244, the operational amplifier 244 includes a first OP input end IN+, a second OP input end IN− and an OP output end OUT. The first OP input end IN+ is electrically connected with the foregoing sense input end SENSE_I of the common mode voltage sensor 24 to receive the reference voltage source $VCM_{REF}$. The OP output end OUT is electrically connected with the sense output end SENSE_O of the common mode voltage sensor 24 as well as the second OP input end IN− of the operational amplifier 244. The operational amplifier 244 is further connected with the comparator 242 to receive the first outcome signal PL and the second outcome signal PU, so the operational amplifier 244 accordingly generates and outputs an OP output signal at the OP output end OUT which is electrically connected with the sense output end SENSE_O to serve as the sense output voltage VSENSE_O.

According to the embodiment of the present invention, the operational amplifier 244 is designed to function as:
if the first outcome signal PL=GND, and the second outcome signal PU=GND, the operational amplifier 244 acts as an inverting closed-loop with unity gain feedback connection, the OP output signal=the sense output voltage VSENSE_O, and the sense output voltage VSENSE_O is set to the reference voltage source $VCM_{REF}$; and if the first outcome signal PL=VCC, and the second outcome signal PU=GND, the OP output signal=the sense output voltage VSENSE_O=GND; and if the first outcome signal PL=GND, and the second outcome signal PU=VCC, the OP output signal=the sense output voltage VSENSE_O=VCC.

Nevertheless, the present invention is not limited to such an embodiment as referring to FIG. 9. For people who are skilled in the art, modifications and variations are allowed to be made to the present invention without departing the spirits of the present invention, and yet still fall into the scope of the present invention. For instance, functions of the common mode voltage sensor of the present invention can be simplified according to the input common mode voltage receiving range of the receiving amplifier, and varies with the input common mode voltage receiving range of the receiving amplifier.

Figure 10A:
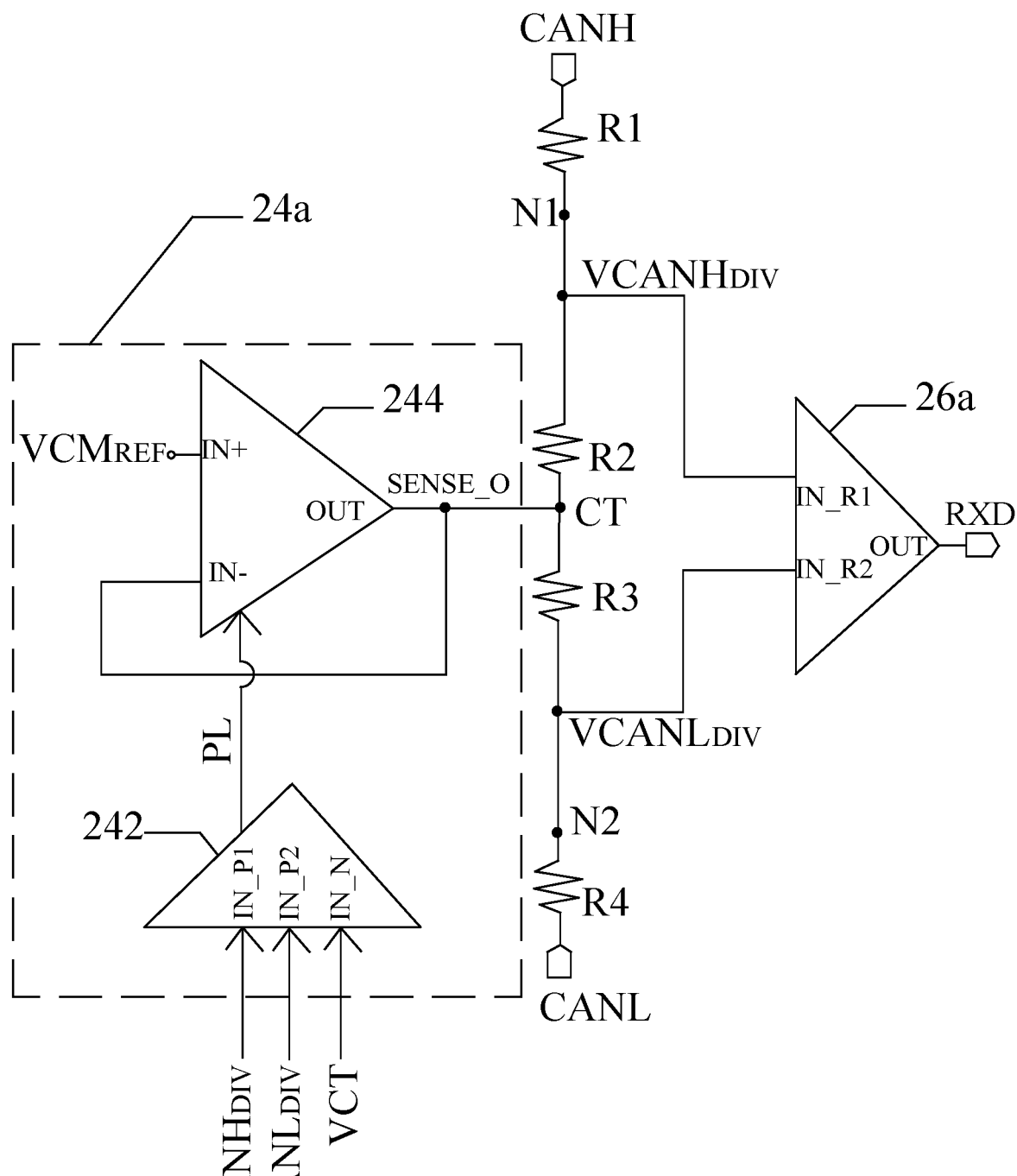
FIG. 10A shows a detailed circuit diagram for implementing the receiver circuit with input common mode voltage sensing in accordance with a second embodiment of the present invention.
Figure 10B:
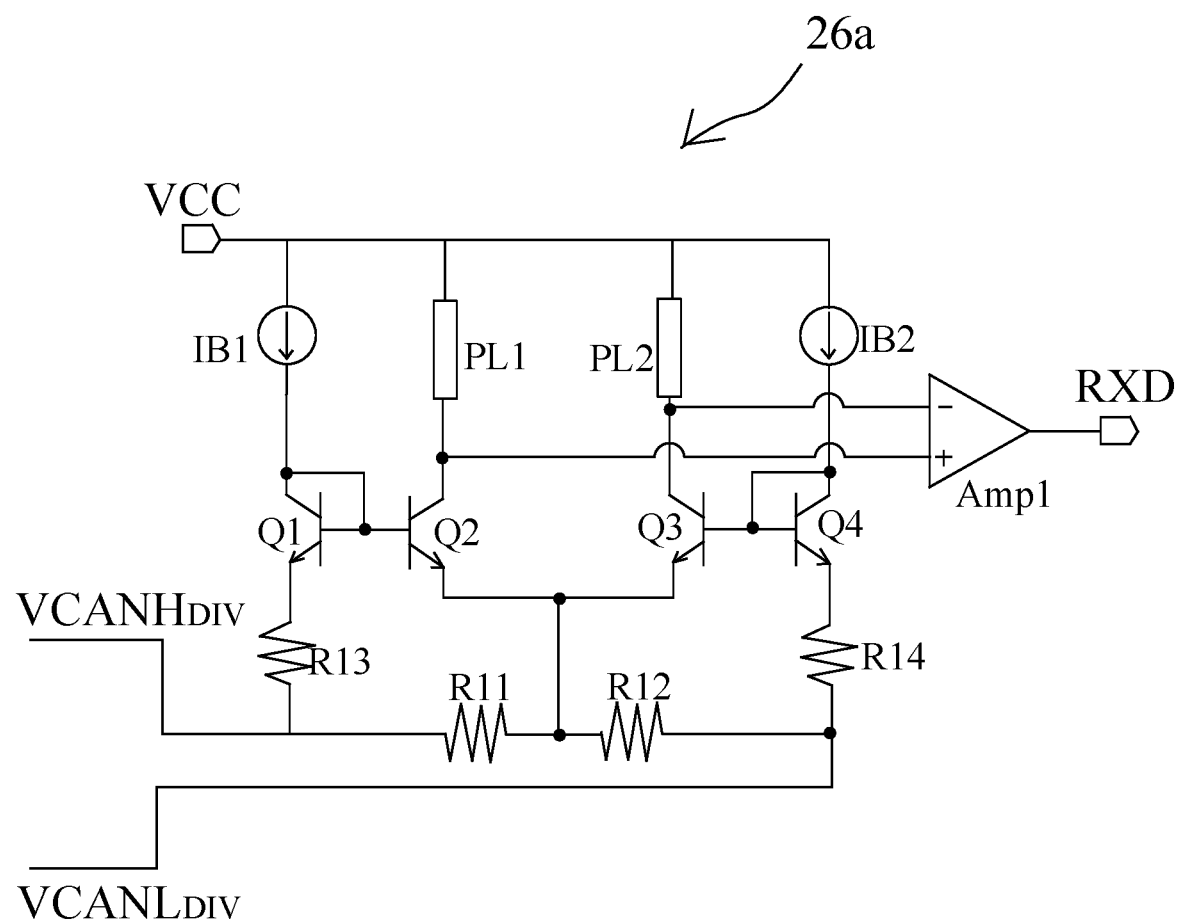
FIG. 10B shows a detailed circuit diagram of the receiving amplifier in FIG. 10A in accordance with the second embodiment of the present invention.

For instance, please refer to FIG. 10A and FIG. 10B, which show a detailed circuit diagram for implementing the receiver circuit with input common mode voltage sensing in accordance with a second embodiment of the present invention. FIG. 10B shows a variation embodiment of the receiving amplifier according to the second embodiment of the present invention in FIG. 10A. In such a second embodiment of the present invention, the receiving amplifier 26a is electrically connected with the high end voltage division VCANH$_{DIV}$, the low end voltage division VCANL$_{DIV}$ and the power source voltage VCC, and the receiving amplifier 26a amplifies a differential signal between the first node N1 and the second node N2 of the resistor assembly 22 and converts the differential signal into a single-end signal as the resultant signal.

The receiving amplifier 26a comprises a plurality of transistors Q1, Q2, Q3, Q4, a plurality of resistors R11, R12, R13, R14, loads PL1, PL2, current sources IB1, IB2 and a first output amplifier Amp1. Relevant information and descriptions are correlated with the U.S. Pat. No. 9,509,488. Since such an receiving amplifier 26a is able to receive the input common mode voltage on receiving amplifier input (V$_{CM\_DIV}$), which is ranging from {negative infinity (−∞) to (maximum input voltage of the first output amplifier Amp1−VCE$_{Q2,3}$)}, the comparator 242 of the common mode voltage sensor 24a only needs to determine:

if V$_{CM\_DIV}$>[VCT+V$_{TH\_SEN}$], then VSENSE_O=VCT=GND;

otherwise, the sense output voltage VSENSE_O is equal to the reference voltage source VCM$_{REF}$.

Under such circumstance, as shown in FIG. 10A, the second outcome signal PU can be removed, and the comparator 242 of the common mode voltage sensor 24a only outputs the first outcome signal PL to the operational amplifier 244 for generating the OP output signal.

Figure 11:
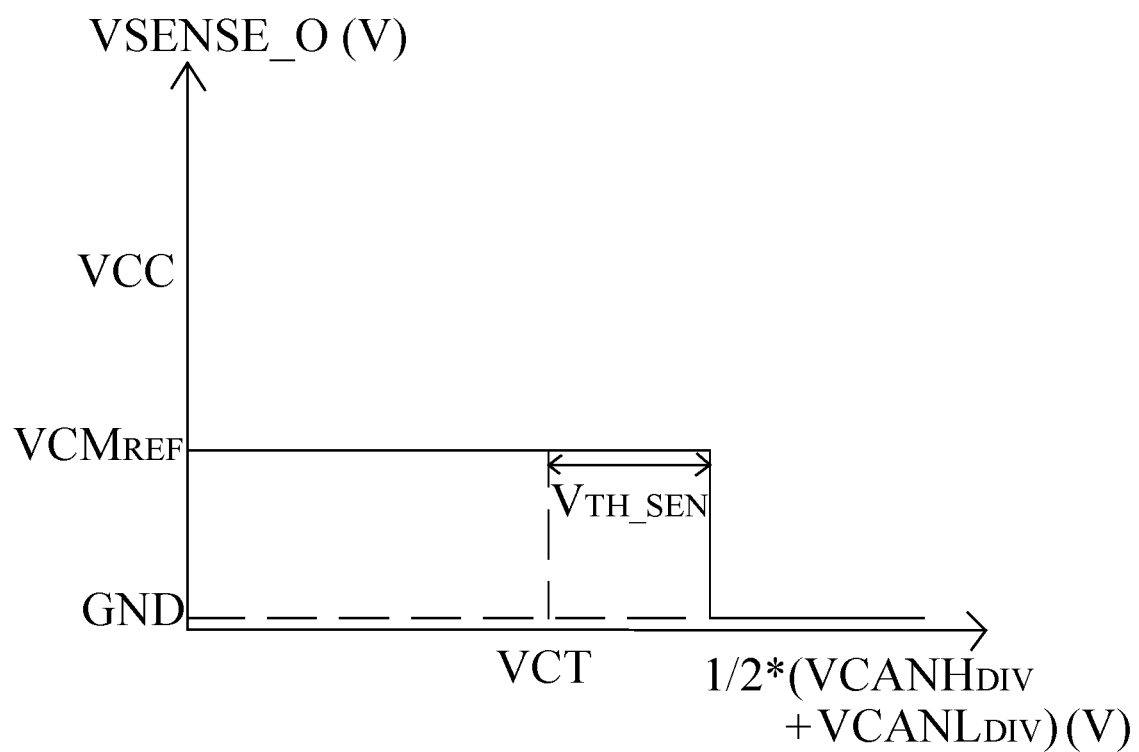
FIG. 11 shows the voltage diagram of the sense output voltage VSENSE_O of the common mode voltage sensor in accordance with the second embodiment of the present invention.

The sense output voltage VSENSE_O of the common mode voltage sensor in accordance with such a second embodiment of the present invention is illustrated as shown in FIG. 11. Therefore, as long as the voltage of (maximum input voltage of the first output amplifier Amp1-VCE$_{Q2,3}$) is designed to be greater than 3.5V (derived from FIG. 6), compare to the prior art in which complex and high-cost dual path receiving amplifiers are needed, the receiver circuit of the present invention only needs to employ one receiving amplifier 26a and a common mode BUS ranging from +50V to −50V can be received.

Figure 12A:
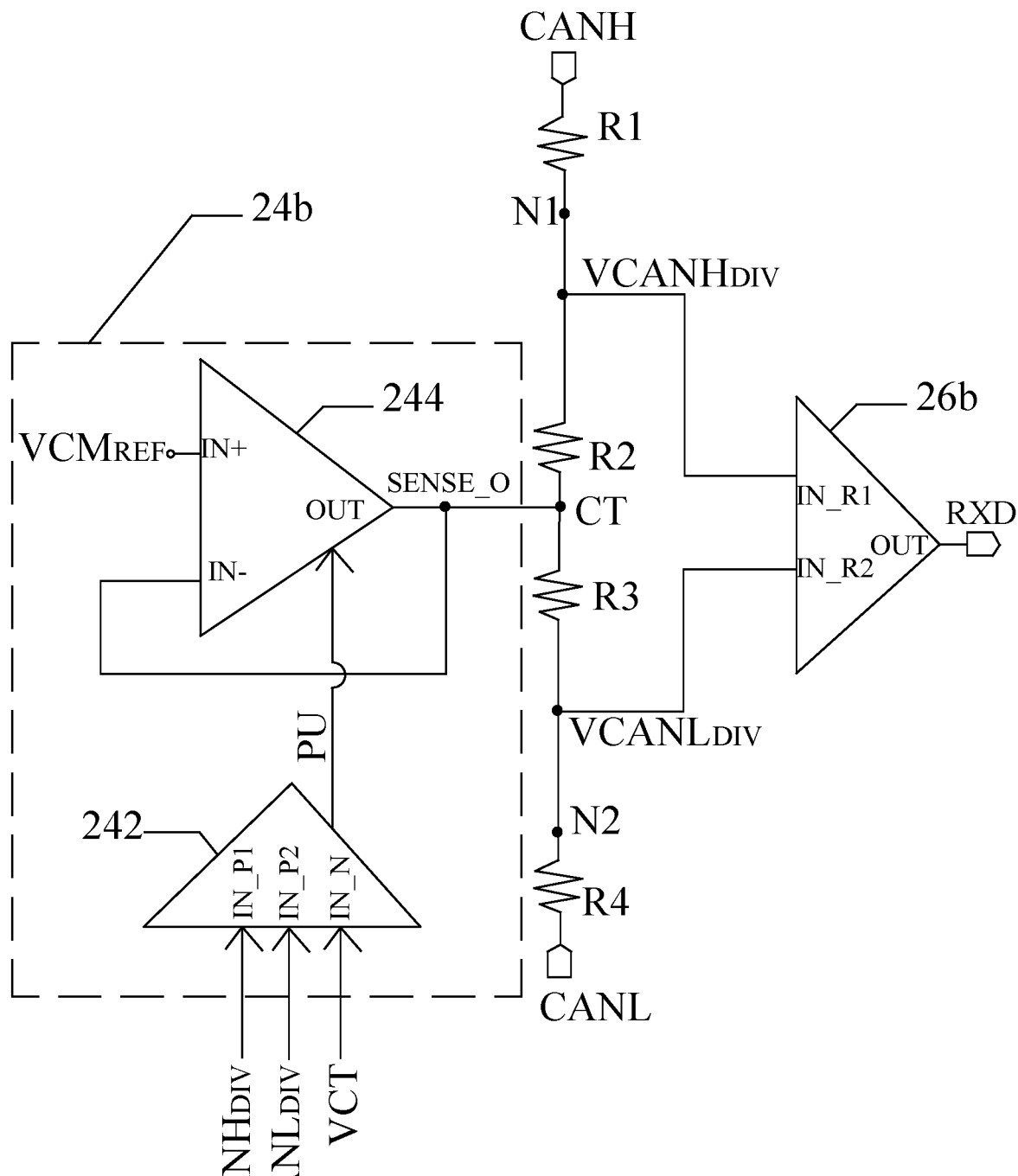
FIG. 12A shows a detailed circuit diagram for implementing the receiver circuit with input common mode voltage sensing in accordance with a third embodiment of the present invention.
Figure 12B:
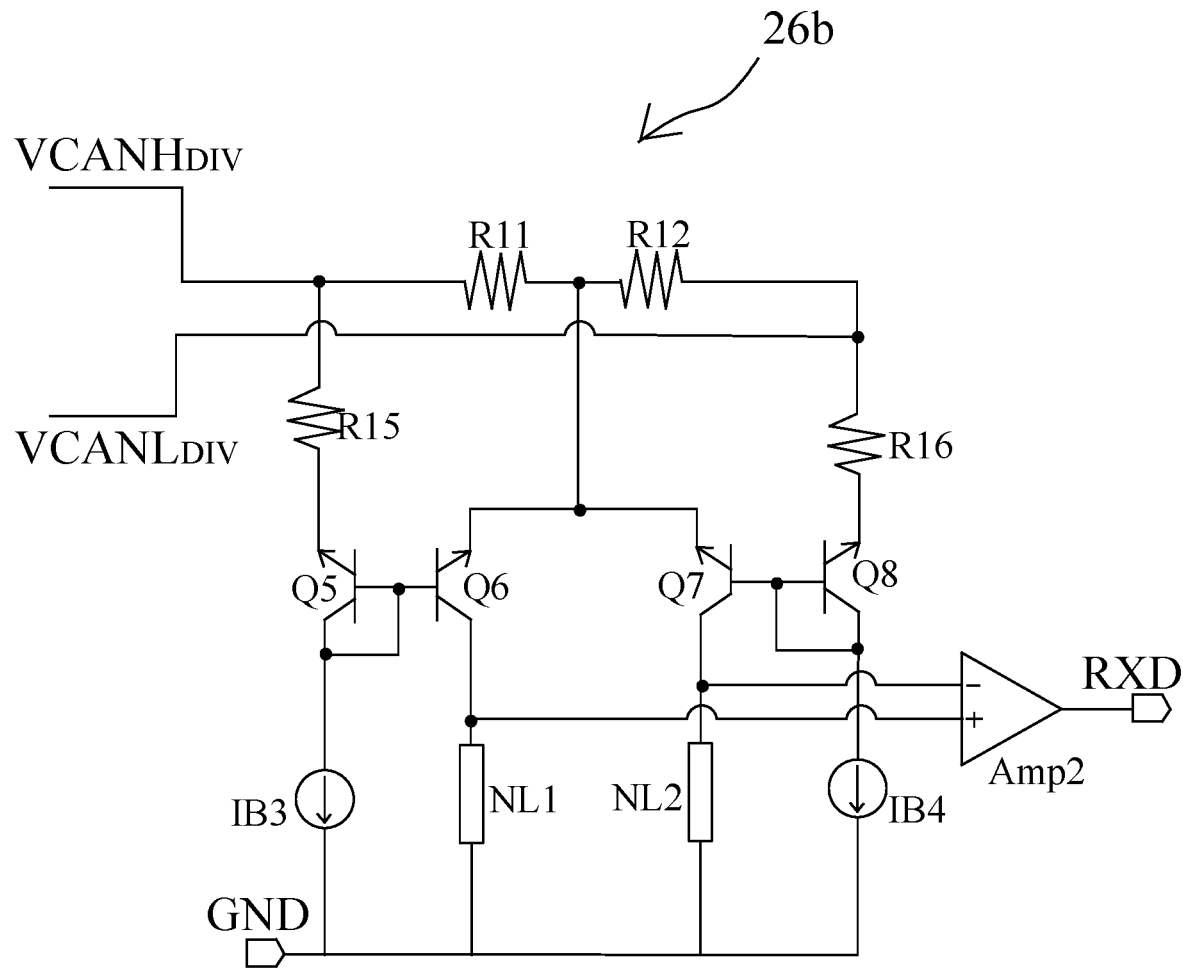
FIG. 12B shows a detailed circuit diagram of the receiving amplifier in FIG. 12A in accordance with the third embodiment of the present invention.

In another aspect, please refer to FIG. 12A and FIG. 12B, which shows a detailed circuit diagram for implementing the receiver circuit with input common mode voltage sensing in accordance with a third embodiment of the present invention. FIG. 12B shows another variation embodiment of the receiving amplifier according to the third embodiment of the present invention in FIG. 12A. In such a third embodiment of the present invention, the receiving amplifier 26b is electrically connected with the high end voltage division VCANH$_{DIV}$, the low end voltage division VCANL$_{DIV}$ and the ground voltage GND, and the receiving amplifier 26b amplifies a differential signal between the first node N1 and the second node N2 of the resistor assembly 22 and converts the differential signal into a single-end signal as the resultant signal.

The receiving amplifier 26b comprises a plurality of transistors Q5, Q6, Q7, Q8, a plurality of resistors R11, R12, R15, R16, loads NL1, NL2, current sources IB3, IB4 and a second output amplifier Amp2. Relevant information and descriptions are correlated with the U.S. Pat. No. 9,509,488. Since such an receiving amplifier 26b is able to receive the input common mode voltage on receiving amplifier input (V$_{CM\_DIV}$), which is ranging from {(minimum input voltage of the second output amplifier Amp2+VCE$_{Q6,7}$) to positive infinity (+∞)}, the comparator 242 of the common mode voltage sensor 24b only needs to determine:

if V$_{CM\_DIV}$<[VCT−V$_{TH\_SEN}$], then VSENSE_O=VCT=VCC;

otherwise, the sense output voltage VSENSE_O is equal to the reference voltage source VCM$_{REF}$.

Under such circumstance, as shown in FIG. 12A, the first outcome signal PL can be removed, and the comparator 242 of the common mode voltage sensor 24b only outputs the second outcome signal PU to the operational amplifier 244 for generating the OP output signal.

Figure 13:
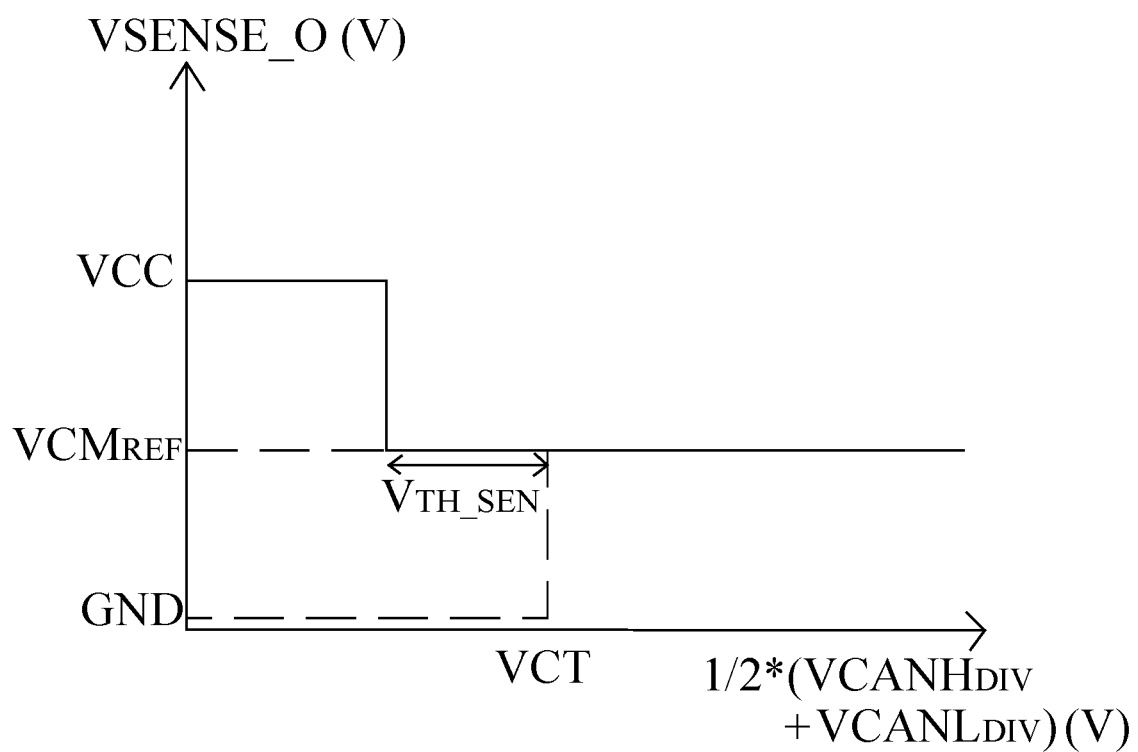
FIG. 13 shows the voltage diagram of the sense output voltage VSENSE_O of the common mode voltage sensor in accordance with the third embodiment of the present invention.

The sense output voltage VSENSE_O of the common mode voltage sensor in accordance with such a third embodiment of the present invention is illustrated as shown in FIG. 13. Therefore, as long as the voltage of (minimum input voltage of the second output amplifier Amp2+VCE$_{Q6,7}$) is designed to be less than 1.5V (derived from FIG. 6), compare to the prior art in which complex and high-cost dual path receiving amplifiers are needed, the receiver circuit of the present invention only needs to employ one receiving amplifier 26b and a common mode BUS ranging from +50V to −50V can be received.

As a result, as compared to the prior design, it is believed that by employing the above mentioned embodiments the present invention has disclosed, the receiver circuit for controller area network (CAN) is able to have the ability to receive differential signal with wide input common mode range (−50V to +50V) that exceeds the typical CAN supply voltage (0 to 5V), without using extra special designed receiving amplifiers, such as dual path receiving amplifiers of the prior arts. And thus, problems occurring in the prior design, comprising high cost, complex circuit diagram and device breakdown issues, are effectively solved. The receiver circuit of the present invention is characterized by having an outstanding input common mode voltage sensing capability, and the common mode voltage of the network in the recessive state is kept to be equal to the common mode voltage of the network in the dominant state. Thereby, the electromagnetic emission is reduced. As a result, the Applicants assert that the present invention is instinct, effective and highly competitive for incoming technology, industries and researches developed in the future and shall be patentable soon as well.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A receiver circuit with input common mode voltage sensing, which is electrically connected with an output end of said receiver circuit of a controller area network (CAN) and applicable to a transceiver integration circuit of said controller area network, comprising:

a resistor assembly, being electrically connected with a high end and a low end of said controller area network (CANH and CANL) and including a first resistor, a second resistor, a third resistor and a fourth resistor, wherein a first node is arranged between said first resistor and said second resistor, a second node is arranged between said third resistor and said fourth resistor, a third node (CT) is arranged between said second resistor and said third resistor, and wherein said first resistor is electrically connected with said high end and said first node, and said fourth resistor is electrically connected with said low end and said second node, and wherein said resistor assembly receives a high end voltage (VCANH) from said high end and a low end voltage (VCANL) from said low end and bucks voltage to generate and output a high end voltage division (VCANH$_{DIV}$) at said first node, a low end voltage division (VCANL$_{DIV}$) at said second node and a contact voltage (VCT) at said third node;

a common mode voltage sensor, including a sense input end (SENSE_I) and a sense output end (SENSE_O), wherein said sense input end (SENSE_I) is electrically connected with a reference voltage source (VCM$_{REF}$) and said sense output end (SENSE_O) is electrically connected to said third node of said resistor assembly (CT), and wherein a first input terminal (IN_P1), a second input terminal (IN_P2) and a third input terminal (IN_N) of said common mode voltage sensor are connected with and receiving said high end voltage division (VCANH$_{DIV}$) from said first node, said low end voltage division (VCANL$_{DIV}$) from said second node and said contact voltage (VCT) from said third node, respectively so as to generate and output a sense output voltage (VSENSE_O) at said sense output end (SENSE_O), and wherein said common mode voltage sensor determines:

if $\{½*[VCANH_{DIV}+VCANL_{DIV}]\}>\{VCT+V_{TH\_SEN}\}$ wherein $V_{TH\_SEN}$ is a preset threshold offset value, then said sense output voltage (VSENSE_O) is set to a ground voltage (GND);

otherwise said sense output voltage (VSENSE_O) is equal to said reference voltage source (VCM$_{REF}$); and a receiving amplifier, including a first receiving end (IN_R1) and a second receiving end (IN_R2) which are respectively connected to said first node of said resistor assembly and said second node of said resistor assembly to receive said high end voltage division (VCANH$_{DIV}$) and said low end voltage division (VCANL$_{DIV}$), such that said receiving amplifier accordingly generates a resultant signal, and outputs said resultant signal to said output end of said receiver circuit of said controller area network (CAN).

2. The receiver circuit with input common mode voltage sensing according to claim 1, wherein said common mode voltage sensor comprises:

a comparator, comprising said first input terminal (IN_P1) and said second input terminal (IN_P2) as two positive input ends, and said third input terminal (IN_N) as one negative input end of said comparator, such that said comparator outputs a first outcome signal (PL) according to said high end voltage division (VCANH$_{DIV}$) from said first input terminal (IN_P1), said low end voltage division (VCANL$_{DIV}$) from said second input terminal (IN_P2) and said contact voltage (VCT) from said third input terminal (IN_N); and an operational amplifier (OP), comprising a first OP input end, a second OP input end and an OP output end, wherein said first OP input end is electrically connected with said sense input end of said common mode voltage sensor to receive said reference voltage source (VCM$_{REF}$), said OP output end is electrically connected with said sense output end of said common mode voltage sensor as well as said second OP input end of said operational amplifier, said operational amplifier is further connected with said comparator to receive said first outcome signal (PL), and said operational amplifier accordingly generates and outputs an OP output signal at said OP output end which is electrically connected with said sense output end (SENSE_O) to serve as said sense output voltage (VSENSE_O).

3. The receiver circuit with input common mode voltage sensing according to claim 2, wherein said preset threshold offset value $V_{TH\_SEN}$ is stored in said comparator.

4. The receiver circuit with input common mode voltage sensing according to claim 2, wherein said operational amplifier is an inverting closed-loop amplifier when said sense output voltage (VSENSE_O) is set to said reference voltage source (VCM$_{REF}$).

5. The receiver circuit with input common mode voltage sensing according to claim 1, wherein said receiving amplifier is electrically connected with said high end voltage division (VCANH$_{DIV}$), said low end voltage division (VCANL$_{DIV}$) and a power source voltage (VCC), and said receiving amplifier amplifies a differential signal between said first node and said second node of said resistor assembly and converts said differential signal into a single-end signal as said resultant signal.

6. The receiver circuit with input common mode voltage sensing according to claim 1, wherein said transceiver integration circuit of said controller area network further comprises a transmitter, and wherein said transmitter is electrically connected with said high end and said low end and transmits a differential signal to said high end and said low end in a dominant state, and wherein a common mode voltage of said differential signal is supplied to and as said reference voltage source.

7. A receiver circuit with input common mode voltage sensing, which is electrically connected with an output end of said receiver circuit of a controller area network (CAN) and applicable to a transceiver integration circuit of said controller area network, comprising:

a resistor assembly, being electrically connected with a high end and a low end of said controller area network (CANH and CANL) and including a first resistor, a second resistor, a third resistor and a fourth resistor, wherein a first node is arranged between said first resistor and said second resistor, a second node is arranged between said third resistor and said fourth resistor, a third node (CT) is arranged between said second resistor and said third resistor, and wherein said first resistor is electrically connected with said high end and said first node, and said fourth resistor is electrically connected with said low end and said second node, and wherein said resistor assembly receives a high end voltage (VCANH) from said high end and a low end voltage (VCANL) from said low end and bucks voltage to generate and output a high end voltage division (VCANH$_{DIV}$) at said first node, a low end voltage division (VCANL$_{DIV}$) at said second node and a contact voltage (VCT) at said third node;

a common mode voltage sensor, including a sense input end (SENSE_I) and a sense output end (SENSE_O), wherein said sense input end (SENSE_I) is electrically connected with a reference voltage source (VCM$_{REF}$) and said sense output end (SENSE_O) is electrically connected to said third node of said resistor assembly (CT), and wherein a first input terminal (IN_P1), a second input terminal (IN_P2) and a third input terminal (IN_N) of said common mode voltage sensor are connected with and receiving said high end voltage division (VCANH$_{DIV}$) from said first node, said low end voltage division (VCANL$_{DIV}$) from said second node and said contact voltage (VCT) from said third node, respectively so as to generate and output a sense output voltage (VSENSE_O) at said sense output end (SENSE_O), and wherein said common mode voltage sensor determines:

if $\{\frac{1}{2}*[VCANH_{DIV}+VCANL_{DIV}]\}<\{VCT-V_{TH\_SEN}\}$ wherein $V_{TH\_SEN}$ is a preset threshold offset value, then said sense output voltage (VSENSE_O) is set to a power source voltage (VCC);

otherwise said sense output voltage (VSENSE_O) is equal to said reference voltage source (VCM$_{REF}$); and a receiving amplifier, including a first receiving end (IN_R1) and a second receiving end (IN_R2) which are respectively connected to said first node of said resistor assembly and said second node of said resistor assembly to receive said high end voltage division (VCANH$_{DIV}$) and said low end voltage division (VCANL$_{DIV}$), such that said receiving amplifier accordingly generates a resultant signal, and outputs said resultant signal to said output end of said receiver circuit of said controller area network (CAN).

8. The receiver circuit with input common mode voltage sensing according to claim 7, wherein said common mode voltage sensor comprises:

a comparator, comprising said first input terminal (IN_P1) and said second input terminal (IN_P2) as two positive input ends, and said third input terminal (IN_N) as one negative input end of said comparator, such that said comparator outputs a second outcome signal (PU) according to said high end voltage division (VCANH$_{DIV}$) from said first input terminal (IN_P1), said low end voltage division (VCANL$_{DIV}$) from said second input terminal (IN_P2) and said contact voltage (VCT) from said third input terminal (IN_N); and an operational amplifier (OP), comprising a first OP input end, a second OP input end and an OP output end, wherein said first OP input end is electrically connected with said sense input end of said common mode voltage sensor to receive said reference voltage source (VCM$_{REF}$), said OP output end is electrically connected with said sense output end of said common mode voltage sensor as well as said second OP input end of said operational amplifier, said operational amplifier is further connected with said comparator to receive said second outcome signal (PU), and said operational amplifier accordingly generates and outputs an OP output signal at said OP output end which is electrically connected with said sense output end (SENSE_O) to serve as said sense output voltage (VSENSE_O).

9. The receiver circuit with input common mode voltage sensing according to claim 8, wherein said preset threshold offset value $V_{TH\_SEN}$ is stored in said comparator.

10. The receiver circuit with input common mode voltage sensing according to claim 8, wherein said operational amplifier is an inverting closed-loop amplifier when said sense output voltage (VSENSE_O) is set to said reference voltage source (VCM$_{REF}$).

11. The receiver circuit with input common mode voltage sensing according to claim 7, wherein said receiving amplifier is electrically connected with said high end voltage division (VCANH$_{DIV}$), said low end voltage division (VCANL$_{DIV}$) and a ground voltage (GND), and said receiving amplifier amplifies a differential signal between said first node and said second node of said resistor assembly and converts said differential signal into a single-end signal as said resultant signal.

12. The receiver circuit with input common mode voltage sensing according to claim 7, wherein said transceiver integration circuit of said controller area network further comprises a transmitter, and wherein said transmitter is electrically connected with said high end and said low end and transmits a differential signal to said high end and said low end in a dominant state, and wherein a common mode voltage of said differential signal is supplied to and as said reference voltage source.

13. A receiver circuit with input common mode voltage sensing, which is electrically connected with an output end of said receiver circuit of a controller area network (CAN) and applicable to a transceiver integration circuit of said controller area network, comprising:

a resistor assembly, being electrically connected with a high end and a low end of said controller area network (CANH and CANL) and including a first resistor, a second resistor, a third resistor and a fourth resistor, wherein a first node is arranged between said first resistor and said second resistor, a second node is arranged between said third resistor and said fourth resistor, a third node (CT) is arranged between said second resistor and said third resistor, and wherein said first resistor is electrically connected with said high end and said first node, and said fourth resistor is electrically connected with said low end and said second node, and wherein said resistor assembly receives a high end voltage (VCANH) from said high end and a low end voltage (VCANL) from said low end and bucks voltage to generate and output a high end voltage division (VCANH$_{DIV}$) at said first node, a low end voltage division (VCANL$_{DIV}$) at said second node and a contact voltage (VCT) at said third node;

a common mode voltage sensor, including a sense input end (SENSE_I) and a sense output end (SENSE_O), wherein said sense input end (SENSE_I) is electrically connected with a reference voltage source (VCM$_{REF}$) and said sense output end (SENSE_O) is electrically connected to said third node of said resistor assembly (CT), and wherein a first input terminal (IN_P1), a second input terminal (IN_P2) and a third input terminal (IN_N) of said common mode voltage sensor are connected with and receiving said high end voltage division (VCANH$_{DIV}$) from said first node, said low end voltage division (VCANL$_{DIV}$) from said second node and said contact voltage (VCT) from said third node, respectively so as to generate and output a sense output voltage (VSENSE_O) at said sense output end (SENSE_O), and wherein said common mode voltage sensor determines:

if $\{½*[VCANH_{DIV}+VCANL_{DIV}]\}>\{VCT+V_{TH\_SEN}\}$, then said sense output voltage (VSENSE_O) is set to a ground voltage (GND); and if $\{½*[VCANH_{DIV}+VCANL_{DIV}]\}<\{VCT-V_{TH\_SEN}\}$, then said sense output voltage (VSENSE_O) is set to a power source voltage (VCC); and if $\{VCT-V_{TH\_SEN}\}<\{½*[VCANH_{DIV}+VCANL_{DIV}]\}<\{VCT+V_{TH\_SEN}\}$, then said sense output voltage (VSENSE_O) is equal to said reference voltage source ($VCM_{REF}$), wherein $V_{TH\_SEN}$ is a preset threshold offset value; and a receiving amplifier, including a first receiving end (IN_R1) and a second receiving end (IN_R2) which are respectively connected to said first node of said resistor assembly and said second node of said resistor assembly to receive said high end voltage division ($VCANH_{DIV}$) and said low end voltage division ($VCANL_{DIV}$), such that said receiving amplifier accordingly generates a resultant signal, and outputs said resultant signal to said output end of said receiver circuit of said controller area network (CAN).

14. The receiver circuit with input common mode voltage sensing according to claim 13, wherein said common mode voltage sensor comprises:

a comparator, comprising said first input terminal (IN_P1) and said second input terminal (IN_P2) as two positive input ends, and said third input terminal (IN_N) as one negative input end of said comparator, such that said comparator outputs a first outcome signal (PL) and a second outcome signal (PU) according to said high end voltage division ($VCANH_{DIV}$) from said first input terminal (IN_P1), said low end voltage division ($VCANL_{DIV}$) from said second input terminal (IN_P2) and said contact voltage (VCT) from said third input terminal (IN_N); and an operational amplifier (OP), comprising a first OP input end, a second OP input end and an OP output end, wherein said first OP input end is electrically connected with said sense input end of said common mode voltage sensor to receive said reference voltage source ($VCM_{REF}$), said OP output end is electrically connected with said sense output end of said common mode voltage sensor as well as said second OP input end of said operational amplifier, said operational amplifier is further connected with said comparator to receive said first outcome signal (PL) and said second outcome signal (PU), and said operational amplifier accordingly generates and outputs an OP output signal at said OP output end which is electrically connected with said sense output end (SENSE_O) to serve as said sense output voltage (VSENSE_O).

15. The receiver circuit with input common mode voltage sensing according to claim 14, wherein said preset threshold offset value $V_{TH\_SEN}$ is stored in said comparator.

16. The receiver circuit with input common mode voltage sensing according to claim 14, wherein if $\{VCT-V_{TH\_SEN}\}<\{½*[VCANH_{DIV}+VCANL_{DIV}]\}<\{VCT+V_{TH\_SEN}\}$, said first outcome signal (PL) is equal to said second outcome signal (PU), which is said ground voltage (GND).

17. The receiver circuit with input common mode voltage sensing according to claim 16, wherein said operational amplifier is an inverting closed-loop amplifier so as to generate said sense output voltage (VSENSE_O) as said reference voltage source ($VCM_{REF}$).

18. The receiver circuit with input common mode voltage sensing according to claim 14, wherein if $\{½*[VCANH_{DIV}+VCANL_{DIV}]\}>\{VCT+V_{TH\_SEN}\}$, then said first outcome signal (PL) is equal to said power source voltage (VCC) and said second outcome signal (PU) is equal to said ground voltage (GND).

19. The receiver circuit with input common mode voltage sensing according to claim 14, wherein if $\{½*[VCANH_{DIV}+VCANL_{DIV}]\}<\{VCT-V_{TH\_SEN}\}$, then said first outcome signal (PL) is equal to said ground voltage (GND) and said second outcome signal (PU) is equal to said power source voltage (VCC).

20. The receiver circuit with input common mode voltage sensing according to claim 13, wherein said transceiver integration circuit of said controller area network further comprises a transmitter, and wherein said transmitter is electrically connected with said high end and said low end and transmits a differential signal to said high end and said low end in a dominant state, and wherein a common mode voltage of said differential signal is supplied to and as said reference voltage source.

\* \* \* \* \*